(12) United States Patent
Zhang et al.

(10) Patent No.: US 10,886,928 B2
(45) Date of Patent: Jan. 5, 2021

(54) FAST PHASE FREQUENCY DETECTOR

(71) Applicant: MONTAGE TECHNOLOGY CO., LTD., Shanghai (CN)

(72) Inventors: Pengzhan Zhang, Shanghai (CN); Zhongyuan Chang, Shanghai (CN); Yanhong Li, Shanghai (CN)

(73) Assignee: MONTAGE TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 16/800,366

(22) Filed: Feb. 25, 2020

(65) Prior Publication Data

US 2020/0295766 A1    Sep. 17, 2020

(30) Foreign Application Priority Data

Mar. 14, 2019    (CN) .......................... 2019 1 0195015

(51) Int. Cl.
*H03L 7/085*    (2006.01)
*H03D 13/00*    (2006.01)

(52) U.S. Cl.
CPC ............. *H03L 7/085* (2013.01); *H03D 13/00* (2013.01)

(58) Field of Classification Search
CPC ......... H03L 7/085; H03L 7/087; H03L 7/089; H03D 13/00; H03D 13/003
See application file for complete search history.

(56) References Cited

U.S. PATENT DOCUMENTS 7,598,775 B2 *   10/2009   Hu .......................... H03L 7/0891
                                                           327/12

* cited by examiner

*Primary Examiner* — Jung Kim
(74) *Attorney, Agent, or Firm* — Oliff PLC

(57) ABSTRACT

A fast phase frequency includes two fast pulsed-latches, a NAND gate, and an adjustable delay circuit, where the fast pulsed-latches include a pulse generating circuit, a reset circuit, and an output latch circuit. The pulse generating circuit is configured to generate a power supply pulse signal when a rising edge of the clock signal arrives, the power supply pulse signal causing the input of the output latch circuit to be a low level. The output latch circuit is configured to maintain its current output state when the clock signal or the reset signal is invalid, and the reset circuit is configured to set the input of the output latch circuit to be a high level. By using fast pulsed-latches with clock and reset control, the fast phase frequency detector shortens the reset loop delay and increases the maximum operating frequency of the phase frequency detector.

10 Claims, 5 Drawing Sheets

FAST PHASE FREQUENCY DETECTOR

FIELD OF THE INVENTION

The application relates to the field of integrated circuit design, and particularly relates to a fast phase frequency detector.

BACKGROUND OF THE INVENTION

As shown in FIG. 1, the main components of a conventional phase frequency detector (PFD) comprise: two D flip-flops (DFFs), a NAND gate, and a delay circuit. The two D flip-flops are driven by a reference clock signal (REF) and a feedback clock signal (FB), respectively. In normal operation, a reset signal (RST) of the D flip-flops is at a high level (i.e., logic high). When the later one of rising edges of the REF and the FB comes, both an up signal (UP) and a down signal (DN) output by the D flip-flops become high level, and the RST becomes low level (i.e., logic low). Then both the D flip-flops are reset simultaneously, both the UP and the DN become low level, and the RST is reset to high level. During the process, the delay for the reset signal RST to change from high level to low level and then become high level again is a reset loop delay, which determines the highest frequency at which the phase frequency detector can operate.

FIG. 2 shows a reset loop of a conventional DFF type phase frequency detector whose reset loop path is shown by the arrow in FIG. 2. When the delay of the delay unit (DELAY) is 0 ps, the shortest reset loop path consists of 3 NAND gates, 2 inverters (INV), and 1 transmission gate.

The maximum operating frequency of the phase frequency detector is determined by its reset loop delay. Due to the use of D flip-flops, the conventional phase frequency detector has a large reset loop delay, which limits the maximum operating frequency of the PFD.

SUMMARY OF THE INVENTION

An objective of the present application is to provide a fast phase frequency detector to improve the speed of the phase frequency detector and save the power consumption of the circuit.

In order to realize the above-mentioned object, an embodiment of the present application discloses a fast phase frequency detector the fast phase frequency detector comprises: a first fast pulsed-latch, a second fast pulsed-latch, a NAND gate and a first delay circuit;

the fast pulsed-latch comprises: a pulse generating circuit, a reset circuit, and an output latch circuit;

an input terminal of the pulse generating circuit is coupled to a clock signal, and an output terminal of the pulse generating circuit is coupled to a first input terminal of the reset circuit;

a second input terminal of the reset circuit is coupled to a reset signal, an output terminal of the reset circuit is coupled to an input terminal of the output latch circuit, and an output terminal of the output latch circuit is configured as an output terminal of the fast pulsed-latch;

the pulse generating circuit is configured to generate a power supply pulse signal when a rising edge of the clock signal arrives, the power supply pulse signal causes the input of the output latch circuit to be a low level;

the output latch circuit is configured to maintain its current output state when the clock signal or the reset signal is invalid;

the reset circuit is configured to set the input of the output latch circuit to be a high level;

the clock signal of the first fast pulsed-latch is a reference clock signal, and the output terminal of the first fast pulsed-latch outputs a UP signal; the clock signal of the second fast pulsed-latch is a feedback clock signal, and the output terminal of the second fast pulsed-latch outputs a DN signal;

a first input terminal of the NAND gate is coupled to the output terminal of the first fast pulsed-latch, and a second input terminal of the NAND gate is coupled to the output terminal of the second fast pulsed-latch, an output terminal of the NAND gate is coupled to an input terminal of the first delay circuit, and an output terminal of the first delay circuit outputs the reset signal for the first fast pulsed-latch and the second fast pulsed-latch.

As described above, by using fast pulsed-latches with clock control and reset control, the fast phase frequency detector of the present application shortens the reset loop delay of the reset signal of the phase frequency detector, and increases the maximum operating frequency of the phase frequency detector circuit.

DETAILED DESCRIPTION

In the following description, many technical details are provided for readers to better understand the present application. However, it is understood by those ordinary skilled in the art that technical solutions claimed to be protected by those claims of the present application can also be realized even without these technical details and not based on various changes and modifications of the following embodiments.

In order to make the purpose, technical solutions and merits of the present application more clear, the embodiments of the present application will be further described in detail below with reference to the accompanying drawings.

Figure 3:
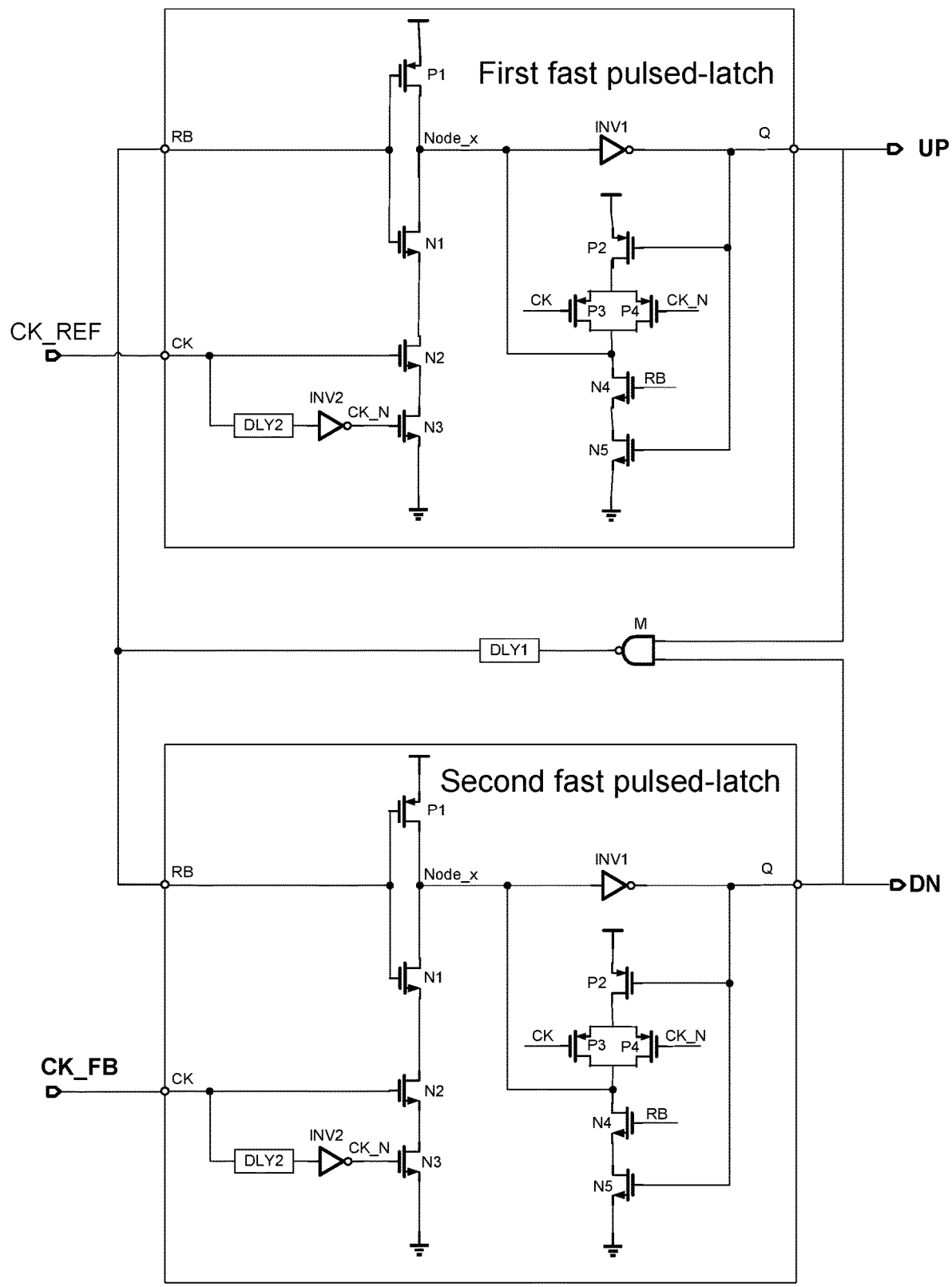
FIG. 3 is a circuit diagram of a fast phase frequency detector according to an embodiment of the present application.

An embodiment of the present application relates to a fast phase frequency detector. FIG. 3 is a circuit diagram of the fast phase frequency detector.

Specifically, as shown in FIG. 3, the fast phase frequency detector comprises:

a first fast pulsed-latch, a second fast pulsed-latch, a NAND gate M and a first delay circuit DLY1.

It should be noted that, in the present embodiment, preferably, the first fast pulsed-latch and the second fast pulsed-latch have exactly the same circuit configuration.

Figure 4:
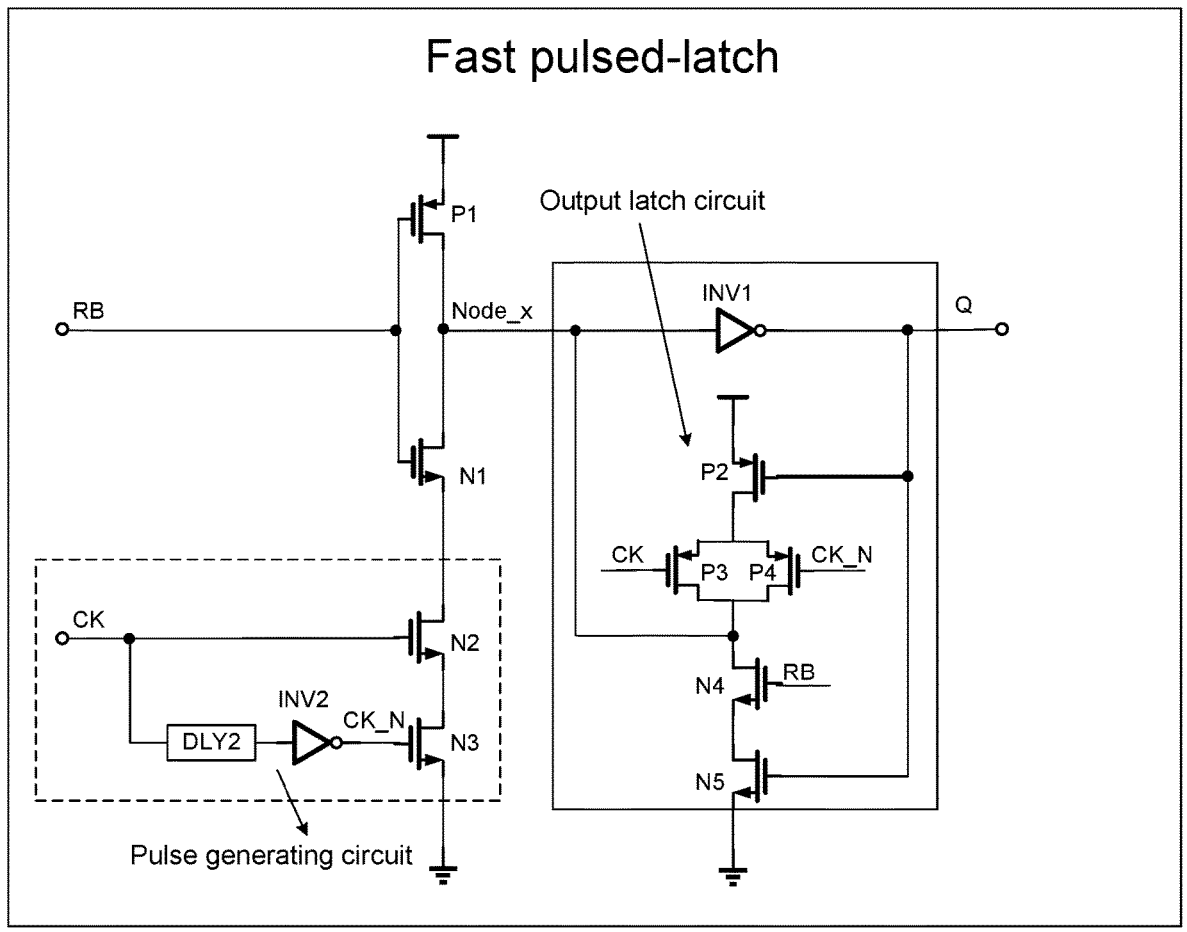
FIG. 4 is a circuit diagram of a fast pulsed-latch according to an embodiment of the present application.

FIG. 4 is a circuit diagram of a fast pulsed-latch according to an embodiment of the present application.

Specifically, as shown in FIG. 4, the fast pulsed-latch of the present application comprises: a pulse generating circuit, a reset circuit, and an output latch circuit.

An input terminal of the pulse generating circuit is coupled to a clock signal CK, and an output terminal of the pulse generating circuit is coupled to a first input terminal of the reset circuit.

A second input terminal of the reset circuit is coupled to a reset signal, an output terminal of the reset circuit is coupled to an input terminal of the output latch circuit, and an output terminal of the output latch circuit is configured as an output terminal Q of the fast pulsed-latch.

The pulse generating circuit is configured to generate a power supply pulse signal when a rising edge of the clock signal arrives, and the power supply pulse signal causes the input of the output latch circuit to be a low level.

The output latch circuit is configured to maintain its current output state when the clock signal or the reset signal is invalid.

The reset circuit is configured to set the input of the output latch circuit to be a high level.

The clock signal of the first fast pulsed-latch is a reference clock signal CK_REF, and the output terminal Q of the first fast pulsed-latch outputs an up signal (UP); the clock signal of the second fast pulsed-latch is a feedback clock signal CK_FB, and the output terminal Q of the second fast pulsed-latch outputs a down signal (DN); a first input terminal of the NAND gate M is coupled to the output terminal Q of the first fast pulsed-latch, and a second input terminal of the NAND gate M is coupled to the output terminal Q of the second fast pulsed-latch, an output terminal of the NAND gate M is coupled to an input terminal of the first delay circuit DLY1, and an output terminal of the first delay circuit DLY1 outputs the reset signal RB of the first fast pulsed-latch and the second fast pulsed-latch.

Further, specifically, as shown in FIG. 4, the pulse generating circuit comprises: a second NMOS transistor N2, a third NMOS transistor N3, a second delay circuit DLY2, and a second inverter INV2.

A gate of the second NMOS transistor N2 is configured as the input terminal of the pulse generating circuit, and is coupled to a clock signal. A drain of the second NMOS transistor N2 is configured as the output terminal of the pulse generating circuit, and is coupled to the first input terminal of the reset circuit. A source of the second NMOS transistor N2 is coupled to a drain of the third NMOS transistor N3.

A gate of the third NMOS transistor N3 is coupled to an output terminal of the second inverter INV2, and a source of the third NMOS transistor N3 is grounded.

An input terminal of the second delay circuit DLY2 is coupled to the gate of the second NMOS transistor N2, and an output terminal of the second delay circuit DLY2 is coupled to an input terminal of the second inverter INV2.

In the present embodiment, preferably, the pulse generating circuit is an input clock rising edge pulse generating circuit for generating a short pulse clock signal, that is, the pulse generating circuit generates a power supply pulse signal when a rising edge of the input clock signal arrives. The short pulse clock signal pulls down an internal node Node_x of the output latch circuit to a low level, so that the output terminal Q of the output latch circuit is at a high level.

The output latch circuit comprises: a first inverter INV1, a second PMOS transistor P2, a third PMOS transistor P3, a fourth PMOS transistor P4, a fourth NMOS transistor N4, and a fifth NMOS transistor N5.

An input terminal of the first inverter INV1 is configured as the input terminal of the output latch circuit, and an output terminal of the first inverter INV1 is configured as the output terminal Q of the output latch circuit.

A source of the second PMOS transistor P2 is coupled to a power supply, a gate of the second PMOS transistor P2 is coupled to the output terminal Q of the output latch circuit, a drain of the second PMOS transistor P2 is coupled to a source of the third PMOS transistor P3.

The source of the third PMOS transistor P3 is coupled to a source of the fourth PMOS transistor P4, a drain of the third PMOS transistor P3 is coupled to a drain of the fourth PMOS transistor P4, the drain of the third PMOS transistor P3 is coupled to the input terminal of the output latch circuit, a gate of the third PMOS transistor P3 is coupled to the clock signal CK, and a gate of the fourth PMOS transistor P4 is coupled to an inverted signal of the clock signal CK_N.

A drain of the fourth NMOS transistor N4 is coupled to the drain of the third PMOS transistor P3, a source of the fourth NMOS transistor N4 is coupled to a drain of the fifth NMOS transistor N5, and a gate of the fourth NMOS transistor N4 is coupled to the reset signal.

A source of the fifth NMOS transistor N5 is grounded, and a gate of the fifth NMOS transistor N5 is coupled to the output terminal Q of the output latch circuit.

In the present embodiment, preferably, the output latch circuit is a switch control output latch circuit, that is, latch without short circuit current.

The output latch circuit is configured to maintain its current output state when the clock signal or the reset signal is invalid. Wherein, when the clock signal or the reset signal is invalid means that the clock signal has no rising edge or the reset signal is at a high level.

The reset circuit comprises: a first PMOS transistor P1 and a first NMOS transistor N1.

A gate of the first PMOS transistor P1 is coupled to a gate of the first NMOS transistor N1, a source of the first PMOS transistor P1 is coupled to a power supply, a drain of the first PMOS transistor P1 is coupled to a drain of the first NMOS transistor N1.

A source of the first NMOS transistor N1 is configured as the first input terminal of the reset circuit, and is coupled to the output of the pulse generating circuit. The gate of the first NMOS transistor N1 is configured as the second input terminal of the reset circuit, and is coupled to the reset signal. The drain of the first NMOS transistor N1 is configured as the output of the reset circuit, and is coupled to the output latch circuit.

The circuit composed of the reset circuit, the fourth NMOS transistor N4, the NAND gate M and the first delay circuit DLY1 is used to set the input of the output latch circuit to a high level, that is, to set the output of the output latch circuit to a low level (i.e., 0).

The fast phase frequency detector generates the UP signal on the rising edge of the reference clock signal CK_REF and the DN signal on the rising edge of the feedback clock signal CK_FB.

The phase difference between the reference clock signal CK_REF and the feedback clock signal CK_FB determines the high level width of the UP signal and the DN signal.

Further, preferably, the first delay circuit DLY1 shown in FIG. 3 is an adjustable delay circuit.

The NAND gate M and the adjustable delay circuit DLY1 determine the high level width of the output UP and DN signals.

It should be noted that the delay circuit, the adjustable delay circuit, and the NAND gate are all prior art well known to those skilled in the art, and are not further described herein.

By using a pulsed-latch with a clock and reset control, the fast phase frequency detector of the present application effectively solves the problem of competition and short circuit current in the conventional pulsed-latch and improves the circuit performance by adding the clock signal CK and the reset signal RB control. Therefore, low transmission delay is achieved, and the competition of the internal nodes in the conventional latch structures is avoided, thereby increasing the speed of the phase frequency detector, and saving the power consumption of the circuit.

The working principle of the fast pulsed-latch of the present application will be described below with reference to FIG. 4: when the reset signal RB is at the high level and the rising edge of the input clock signal arrives, signals CK and CK_N are at a high level simultaneously and remain at the high level for a certain time which is determined by delay time of the inverter INV2, so that the internal node x (Node_x) is discharged and the output Q of the output latch circuit is at a high level; at this time, since signals CK and CK_N are simultaneously at the high level, the pull-up paths of the PMOS transistors (P2, P3, and P4) are turned off, and the circuit from the output latch PMOS transistors (P2, P3 and P4) to the main signal path NMOS transistors (N1, N2 and N3) is opened, thus avoiding the competition between the main signal path and the output latch, and improving the discharge speed of node x. Similarly, when the reset signal RB is at a low level, the pull-up PMOS transistor (P1) is turned on, so that the internal node x (Node_x) is charged and the output Q of the output latch circuit is at a low level. At the same time, since the NMOS transistors (N1 and N4) are turned off when RB is low, the main signal paths (N1, N2 and N3) and the pull-down paths of the output latch (N4 and N5) are all turned off, thus avoiding the competition between the pull-up of PMOS transistor and the pull-down of output latch of reset signal RB at node x, improving the charging speed of node x, and reducing the circuit delay.

Figure 1:
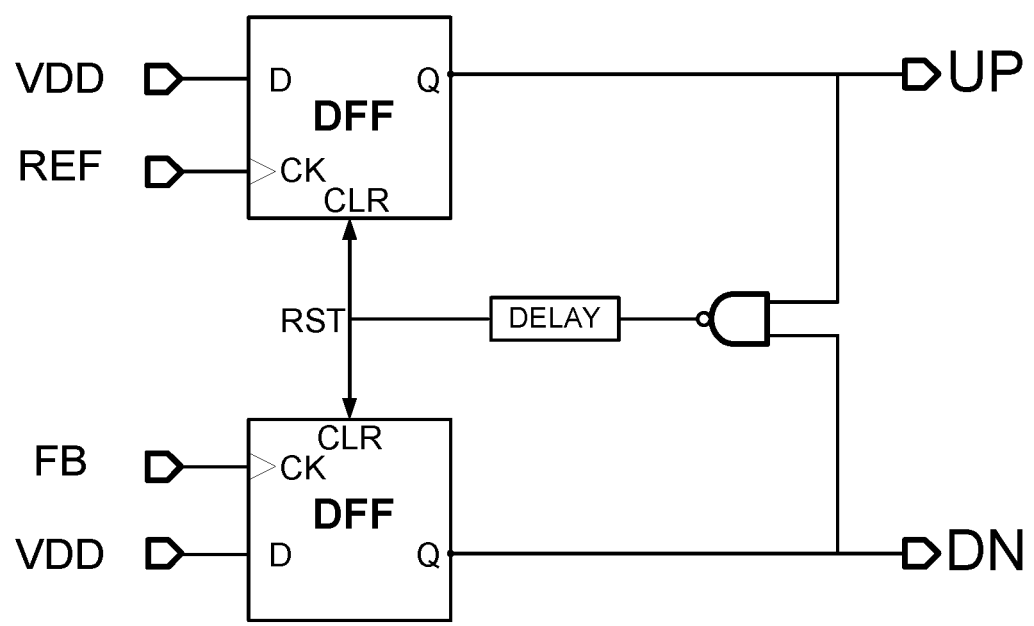
FIG. 1 is a circuit diagram of a conventional DFF type phase frequency detector in the prior art.
Figure 2:
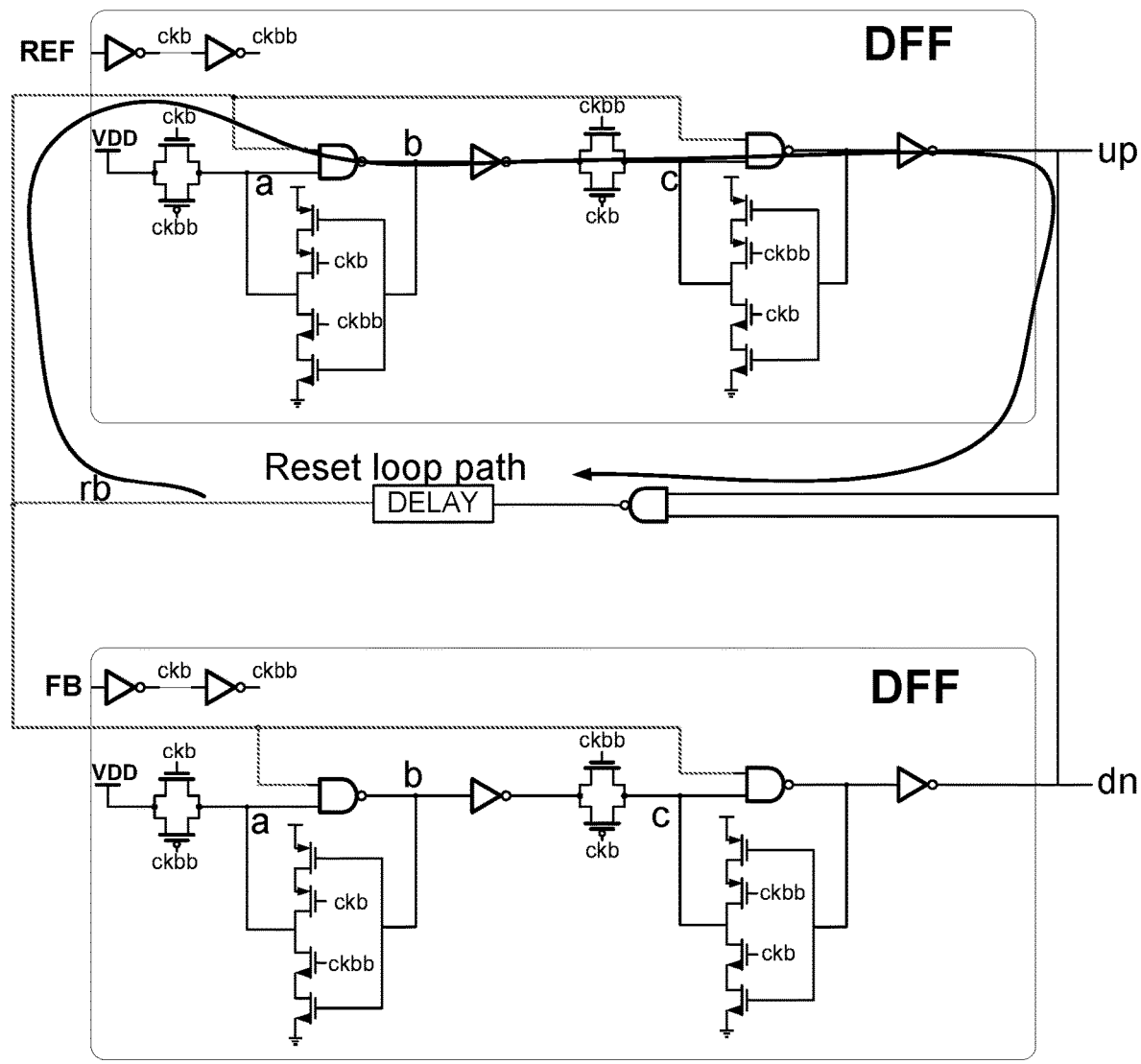
FIG. 2 is a schematic diagram of a reset loop of a conventional DFF type phase frequency detector in the prior art.
Figure 5:
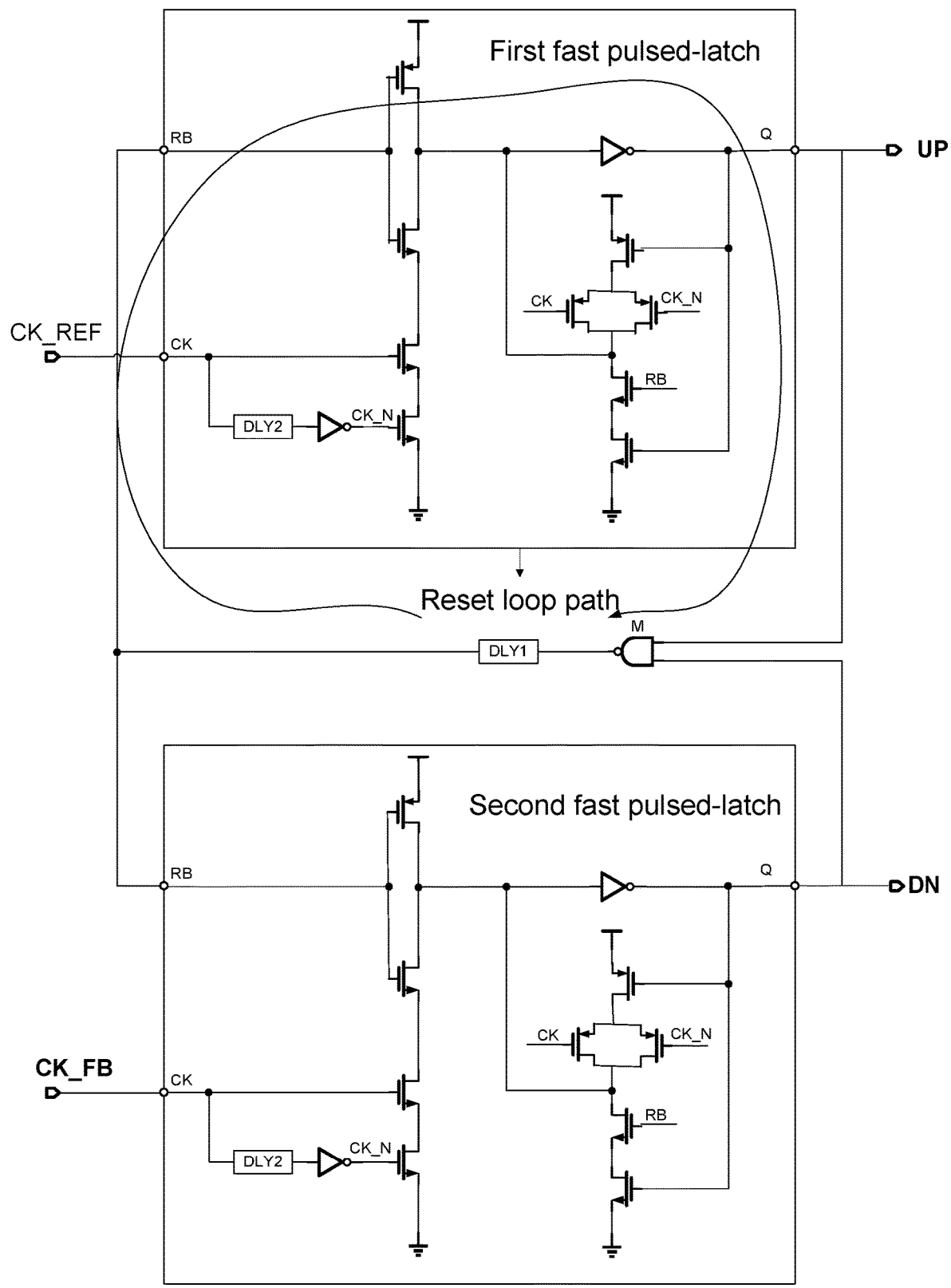
FIG. 5 is a schematic diagram of a reset loop of a fast phase frequency detector according to an embodiment of the present application.

As shown in FIG. 3, the main difference between the present application and the conventional structure is that a fast pulsed-latch is used instead of a D flip-flop, which reduces the reset loop delay of the phase frequency detector. The fast pulsed-latch of the present application has a shorter transmission delay and lower power consumption, when the delay of the first delay circuit DLY1 is 0 ps, the transmission delay of the reset loop path shown by the arrow in FIG. 5 is only the delay of 2 NAND gates (NAND) and 1 inverter (INV). However, the reset loop of the conventional DFF type phase frequency detector (reset loop path as shown by the arrow in FIG. 2), when there is no delay unit (i.e., the delay of the delay unit DELAY is 0 ps), the shortest reset path consists of 3 NANDs, 2 INVs and 1 transmission gate. Compared with the conventional phase frequency detector, the delay of the reset loop of the phase frequency detector of the present application is significantly shortened. Since the maximum operating frequency of the phase frequency detector is determined by the delay of the reset loop, the present application has a higher operating frequency than conventional phase frequency detectors.

Therefore, compared with the conventional phase frequency detector circuit, the phase frequency detector circuit described in the present application has a simpler structure, a smaller occupied area, a higher operating frequency, and lower power consumption, and is suitable for circuit applications such as a high-speed phase-locked loop (PLL).

In summary, the fast phase frequency detector of the present application shortens the reset loop delay and increases the maximum operating frequency of the phase frequency detector by replacing the conventional D flip-flop with a new fast pulsed-latch and avoiding the internal signal competition and short circuit current of the conventional latch structure. In addition, compared with the conventional phase frequency detector, the circuit of the present application has a simpler structure, a higher speed, a smaller area, and lower power consumption.

It should be noted that the circuit components disclosed in the embodiments of the present application are all logical modules, on the physical, a logic module can be a physical module, and may be part of a physical module, or implemented in combination of several physical modules, and physical implementing methods for these logic modules themselves are not the most important, the combination of functions achieved by these logic modules is the key to solve the technical problem disclosed in the present application. Furthermore, in order to highlight innovative part of the present application, the above circuit or device embodiments of the present application do not introduce the modules which are not related closely to solve the technical problem disclosed in the present application, which does not indicate that the above circuit or device embodiments do not include other modules.

It should be explained that in the claims and description of the present application, relationship terms such as first, second etc are just utilized to distinguish one entity or manipulation from another entity or manipulation, instead of requiring or indicating any practical relation or sequence existing between these entities or manipulations. And, the terms "include", "comprise" or any other variant indicate to nonexclusive covering, thus the process, method, article or equipment including a series of elements not only includes those elements, but also includes other elements which are not definitely listed, or inherent elements of this process, method, article or equipment. Without more limitations, the element defined by the phrase "include a" does not exclude additional same elements existing in the process, method, article or equipment of this element.

By referring to some preferred embodiments of this invention, this invention has been illustrated and described. But it should be understood to those skilled in the art that various other changes in the forms and details may be made without departing from the principles and scope of the invention.

What is claimed is:

1. A fast phase frequency detector, comprising:
a first fast pulsed-latch, a second fast pulsed-latch, a NAND gate and a first delay circuit, wherein:
the fast pulsed-latches comprises: a pulse generating circuit, a reset circuit, and an output latch circuit;
an input terminal of the pulse generating circuit is coupled to a clock signal, and an output terminal of the pulse generating circuit is coupled to a first input terminal of the reset circuit;
a second input terminal of the reset circuit is coupled to a reset signal, an output terminal of the reset circuit is coupled to an input terminal of the output latch circuit, and an output terminal of the output latch circuit is configured as an output terminal of the fast pulsed-latch;
the pulse generating circuit is configured to generate a power supply pulse signal when a rising edge of the clock signal arrives, the power supply pulse signal causing the input of the output latch circuit to be a low level;
the output latch circuit is configured to maintain its current output state when the clock signal or the reset signal is invalid;
the reset circuit is configured to set the input of the output latch circuit to be a high level;

the clock signal of the first fast pulsed-latch is a reference clock signal, and the output terminal of the first fast pulsed-latch outputs an UP signal;

the clock signal of the second fast pulsed-latch is a feedback clock signal, and the output terminal of the second fast pulsed-latch outputs a DN signal; and a first input terminal of the NAND gate is coupled to the output terminal of the first fast pulsed-latch, and a second input terminal of the NAND gate is coupled to the output terminal of the second fast pulsed-latch, an output terminal of the NAND gate is coupled to an input terminal of the first delay circuit, and an output terminal of the first delay circuit outputs the reset signal for the first fast pulsed-latch and the second fast pulsed-latch.

2. The fast phase frequency detector of claim 1, wherein:

the pulse generating circuit comprises: a second NMOS transistor, a third NMOS transistor, a second delay circuit, and a second inverter;

a gate of the second NMOS transistor is configured as the input terminal of the pulse generating circuit, a drain of the second NMOS transistor is configured as the output terminal of the pulse generating circuit, and a source of the second NMOS transistor is coupled to a drain of the third NMOS transistor;

a gate of the third NMOS transistor is coupled to an output terminal of the second inverter, and a source of the third NMOS transistor is grounded; and an input terminal of the second delay circuit is coupled to the gate of the second NMOS transistor, and an output terminal of the second delay circuit is coupled to an input terminal of the second inverter.

3. The fast phase frequency detector of claim 1, wherein:

the output latch circuit comprises: a first inverter, a second PMOS transistor, a third PMOS transistor, a fourth PMOS transistor, a fourth NMOS transistor, and a fifth NMOS transistor;

an input terminal of the first inverter is configured as the input terminal of the output latch circuit, and an output terminal of the first inverter is configured as the output terminal of the output latch circuit;

a source of the second PMOS transistor is coupled to a power supply, a gate of the second PMOS transistor is coupled to the output terminal of the output latch circuit, a drain of the second PMOS transistor is coupled to a source of the third PMOS transistor;

the source of the third PMOS transistor is coupled to a source of the fourth PMOS transistor, a drain of the third PMOS transistor is coupled to a drain of the fourth PMOS transistor, the drain of the third PMOS transistor is coupled to the input terminal of the output latch circuit, a gate of the third PMOS transistor is coupled to the clock signal, and a gate of the fourth PMOS transistor is coupled to an inverted signal of the clock signal;

a drain of the fourth NMOS transistor is coupled to the drain of the third PMOS transistor, a source of the fourth NMOS transistor is coupled to a drain of the fifth NMOS transistor, and a gate of the fourth NMOS transistor is coupled to the reset signal; and a source of the fifth NMOS transistor is grounded, and a gate of the fifth NMOS transistor is coupled to the output terminal of the output latch circuit.

4. The fast phase frequency detector of claim 1, wherein:

the reset circuit comprises: a first PMOS transistor and a first NMOS transistor;

a gate of the first PMOS transistor is coupled to a gate of the first NMOS transistor, a source of the first PMOS transistor is coupled to a power supply, a drain of the first PMOS transistor is coupled to a drain of the first NMOS transistor; and a source of the first NMOS transistor is configured as the first input terminal of the reset circuit, the gate of the first NMOS transistor is configured as the second input terminal of the reset circuit, the drain of the first NMOS transistor is configured as the output of the reset circuit.

5. The fast phase frequency detector of claim 1, wherein when the clock signal or the reset signal is invalid means that the clock signal has no rising edge or the reset signal is at a high level.

6. The fast phase frequency detector of claim 1, wherein the rising edge of the reference clock signal generates the UP signal, and the rising edge of the feedback clock signal generates the DN signal.

7. The fast phase frequency detector of claim 6, wherein the phase difference between the reference clock signal and the feedback clock signal determines the high level width of the UP signal and the DN signal.

8. The fast phase frequency detector of claim 1, wherein the first delay circuit is an adjustable delay circuit.

9. The fast phase frequency detector of claim 1, wherein the output latch circuit is a switch control output latch circuit.

10. The fast phase frequency detector of claim 1, wherein the transmission delay of the reset loop of the fast phase frequency detector is the delay of two NAND gates and one inverter.

* * * * *